United States Patent [19]

Hopkins et al.

[11] Patent Number: 5,873,937
[45] Date of Patent: Feb. 23, 1999

[54] METHOD OF GROWING 4H SILICON CARBIDE CRYSTAL

[75] Inventors: Richard H. Hopkins, Export; Godfrey Augustine, Pittsburgh; H. McDonald Hobgood, Murrysville, all of Pa.

[73] Assignee: Northrop Grumman Corporation, Los Angeles, Calif.

[21] Appl. No.: 850,257

[22] Filed: May 5, 1997

[51] Int. Cl.$^6$ .................................................. H01L 21/100
[52] U.S. Cl. .............................. 117/105; 117/88; 117/104
[58] Field of Search ............................... 117/105, 88, 101

[56] References Cited

U.S. PATENT DOCUMENTS

Re. 34,861  2/1995  Davis ...................................... 117/105

OTHER PUBLICATIONS

Controlled sublimation growth of single crystalline 4H–SiC and 6H–SiC and identification of polytypes by x–ray diffraction, "Nippon Steel Corp".

Influence of surface energy on the growth of 6H and 4H–SiC polytypes by sublimation "Siemens Research Labs".

Control of polytype formation by surface energy effects during the growth of SiC monocrystals by the sublimation method "Siemens Reserch Labs".

*Primary Examiner*—R. Bruce Breneman
*Assistant Examiner*—Shamin Ahmed
*Attorney, Agent, or Firm*—Walter G. Sutcliff

[57] ABSTRACT

A method of growing 4-H polytype silicon carbide crystals in a physical vapor transport system where the surface temperature of the crystal is maintained at less than about 2160° C. and the pressure inside the PVT system is decreased to compensate for the lower growth temperature.

14 Claims, 5 Drawing Sheets

METHOD OF GROWING 4H SILICON CARBIDE CRYSTAL

FIELD OF INVENTION

The present invention relates to silicon carbide crystal growth. More specifically, the present invention relates to methods of growing silicon carbide crystals of the 4H-polytype using a physical vapor transport system.

BACKGROUND OF INVENTION

Silicon carbide semiconductor materials are currently used in high power electronic applications because of their wide bandgap, high breakdown voltage, high electron mobility, and high thermal conductivity. Silicon carbide semiconductors have advantages over silicon and other semiconductor material in high power applications. However, the functional advantages of silicon carbide semiconductors is offset by the cost of manufacture, which in many applications is greater than silicon and other devices. Greater use of silicon carbide semiconductors will depend on whether the cost of manufacture can be decreased.

Generally, silicon carbide semiconductor devices are fabricated by the steps of 1) growing a silicon carbide crystal, also referred to as a boule; 2) slicing the boule into silicon carbide wafers; 3) polishing the wafers to thereby produce a silicon carbide substrate; 4) growing an epitaxial layer on the silicon carbide substrate; and 5) fabricating a device utilizing the epitaxial layer alone or in combination with the substrate. The present invention is generally directed towards the first step of growing a silicon carbide crystal of the 4H polytype.

Silicon carbide crystals occur in an abundance of polytypes (e.g. 2H, 4H and 6H) which are individual crystal structures differing mainly in the repetition pattern of the atomic stacking sequence, see FIG. 1. Each polytype exhibits different electronic properties (i.e. bandgap, effective mass, carrier mobility etc.). Experiments have shown that in high frequency applications, the 4H polytype has advantages over 2H and 6H polytype. Compared to 6H polytype, the 4H polytype exhibits a factor of seven higher electron mobility and significantly less anisotropy in its electrical properties.

SiC Boules can be grown using a physical vapor transport system. As shown in FIG. 2, a physical vapor transport system may include a growth chamber 10 filled with an ambient gas 17 and having a seed holder 12, a seed crystal 14 fixed to the seed holder 12 and a source material 18. Operationally, the growth chamber 10 is heated to cause sublimation of the source material 18 whereby the source material essentially evaporates into the ambient gas 17 and thereafter contacts the seed crystal 14 causing crystal growth from the surface of the seed crystal 14. The crystal grows in a direction from the seed crystal 14 towards the source material 18. When silicon carbide boules are grown in the <0001> direction (the orientation normally employed for electronic devices), the seed crystal 14 is silicon carbide having a silicon face and a carbon face, and the source material 18 is silicon carbide. The composition of the ambient gas 17 determines the doping characteristics of the resulting boule. For example, a highly conductive silicon carbide substrate would be fabricated from a boule doped with nitrogen. Such a boule would be grown in an ambient gas 17 containing nitrogen.

It is undesirable to produce boules having mixtures of different polytypes. While it is necessary to grow the silicon carbide crystal from the carbon face of the seed crystal, such is not sufficient to achieve long boules. In practice in prior art systems where 4-H polytype boules are desired, the yield of the 4-H polytype typically decreases as the length of the boule increases. That is, as the length of the boule increases the likelihood of producing a 4-H/6-H polytype mixture increases. Therefore, silicon carbide crystals having a high percentage of 4-H polytype tend to be relatively short in length. Therefore, it is desirable to provide a method of growing boules where the yield of the 4-H polytype in the resulting boule is not affected by the length of the boule. In addition, in maximizing the 4-H polytype yield, it is also desirable to maximize the growth rate of the boule.

DETAILED DESCRIPTION OF INVENTION

A. 4H/6H Yield vs Growth Temperature

Figure 3:
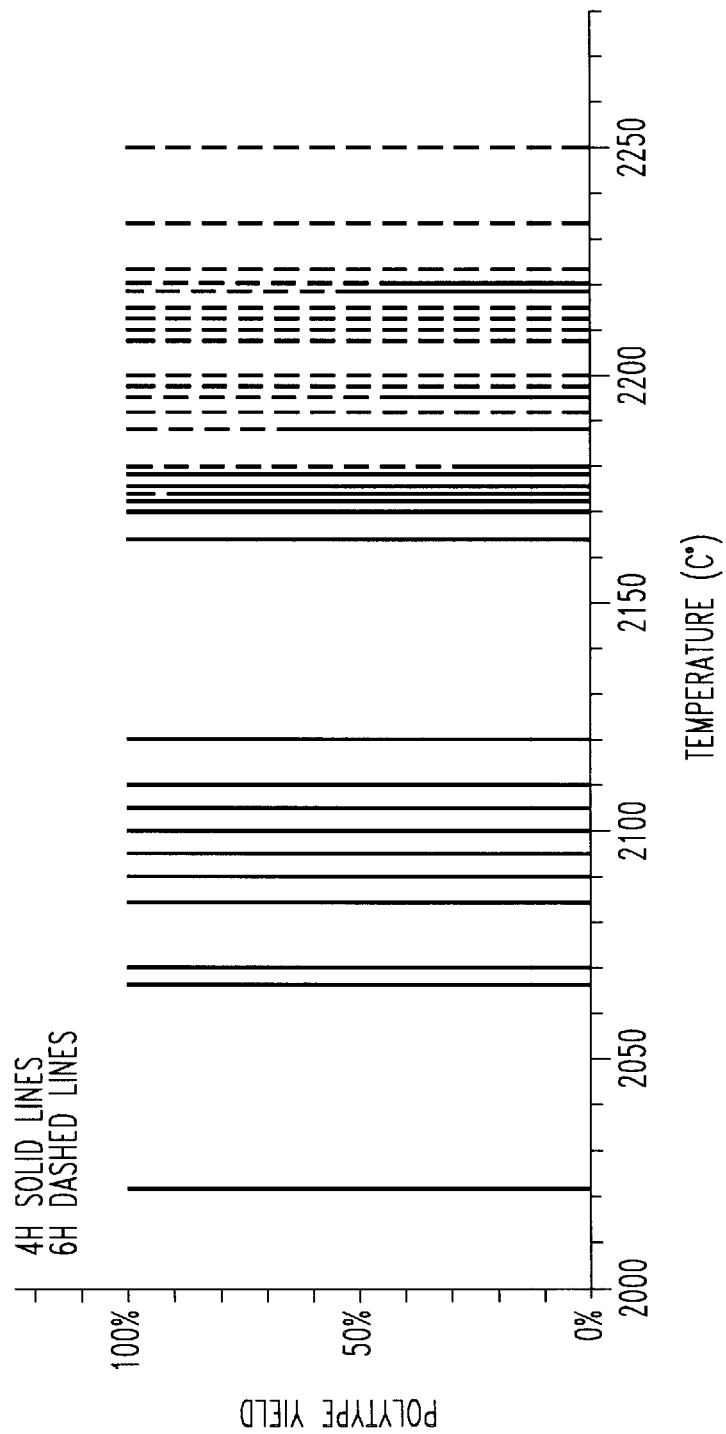
FIG. 3 is a graphical representation of silicon carbide 4H/6H polytype yield as a function of growth temperature.

FIG. 3 shows empirical data of silicon carbide 4H/6H polytype yield as a function of the growth temperature (e.g., the temperature of the growth chamber at the seed crystal) for <0001> crystals grown from the carbon face of the seed crystal. The graph shows 1) pure 4H polytype yield when the growth temperature is less than about 2160° C.; 2) 4H/6H polytype mixture when the growth temperature is between about 2160° C. and 2225° C.; and 3) pure 6H yield when the growth temperature is greater than about 2225° C. Thus, to achieve the 4H polytype, not only must growth proceed from the carbon face, but also the temperature of the growth chamber at the seed crystal should be less than about 2160° C.

However, in PVT systems, the temperature inside the growth chamber is not uniform. Referring again to FIG. 2, a temperature gradient exists such that the temperature increases from the seed crystal 14 through the ambient gas 17 to the source material 18. For example, calculations have shown that a measured temperature of about 2100° C. at the seed crystal 14 corresponds to between 2200° –2250° C. at the ambient gas 17 and between about 2250° –2300° C. at the source material 18. During crystal growth, crystal structures continuously form on the surface of the crystal. As the crystal grows, the crystal surface becomes hotter as it moves from the seed crystal 14 through the ambient gas 17 towards the source material 18. This continuous increase in the temperature of the crystal surface increasingly affects the 4H/6H yield as the crystal grows. For example, where the temperature of the seed crystal 14 is held constant at 2160° C., 4H polytype will initially grow from the surface of the seed crystal 14. However, as the crystal grows and the crystal surface moves away from the seed crystal 14, the temperature of the crystal surface will rise above the 2160° C. threshold thereby decreasing the likelihood of achieving pure 4H polytype.

According to the invention, in order to maximize the 4H polytype yield, the temperature at the crystal surface must be maintained at less than about 2160° C. and preferably at about 2100° C.

As discussed in the following section, the temperature of the growth chamber affects the sublimation rate and thus the crystal growth rate. Everything else being equal, a decrease in the temperature of the growth chamber decreases the sublimation rate and thus the crystal growth rate.

B. Sublimation

Figure 1:
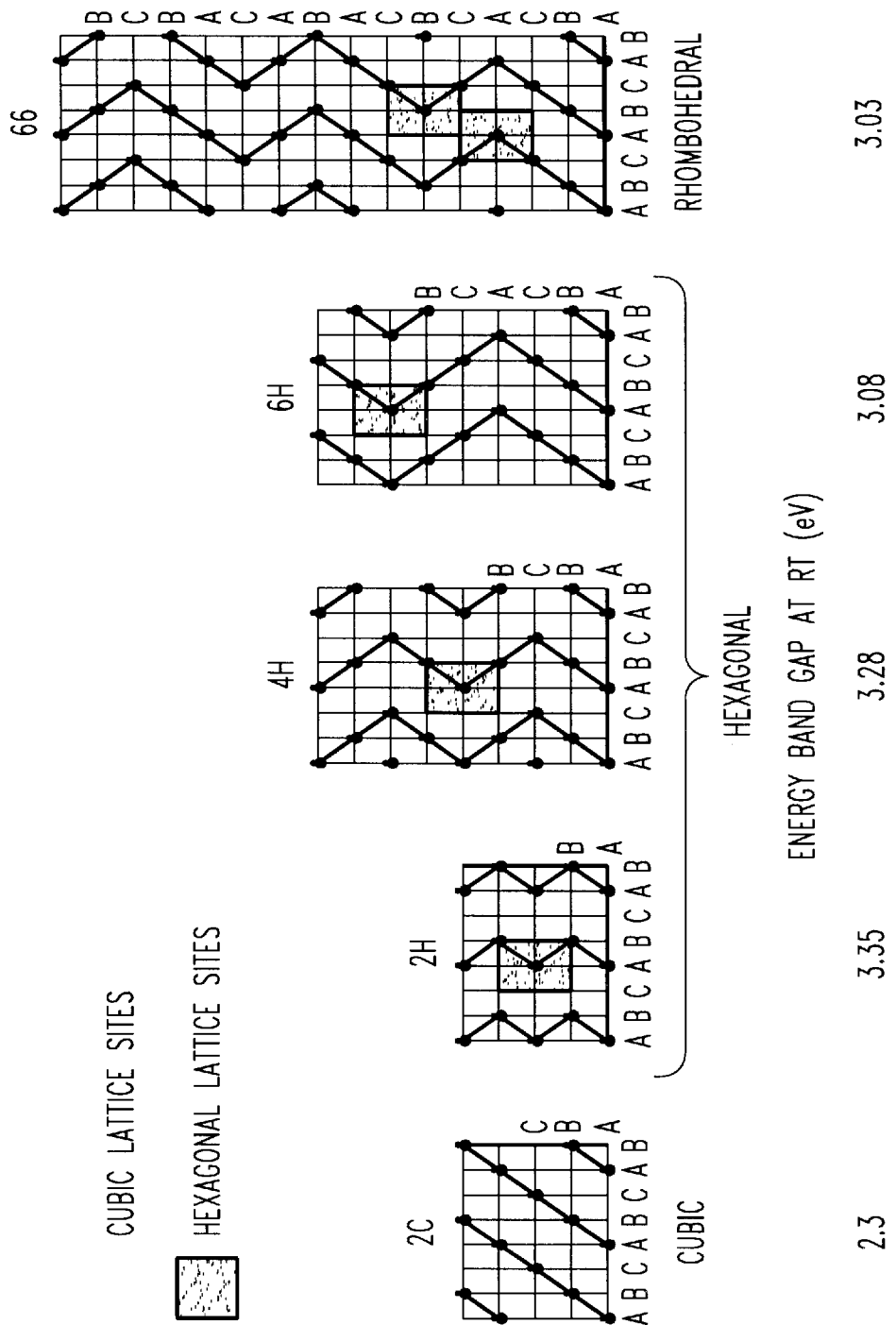
FIG. 1 is schematic of various crystal polytypes in SiC.
Figure 2:
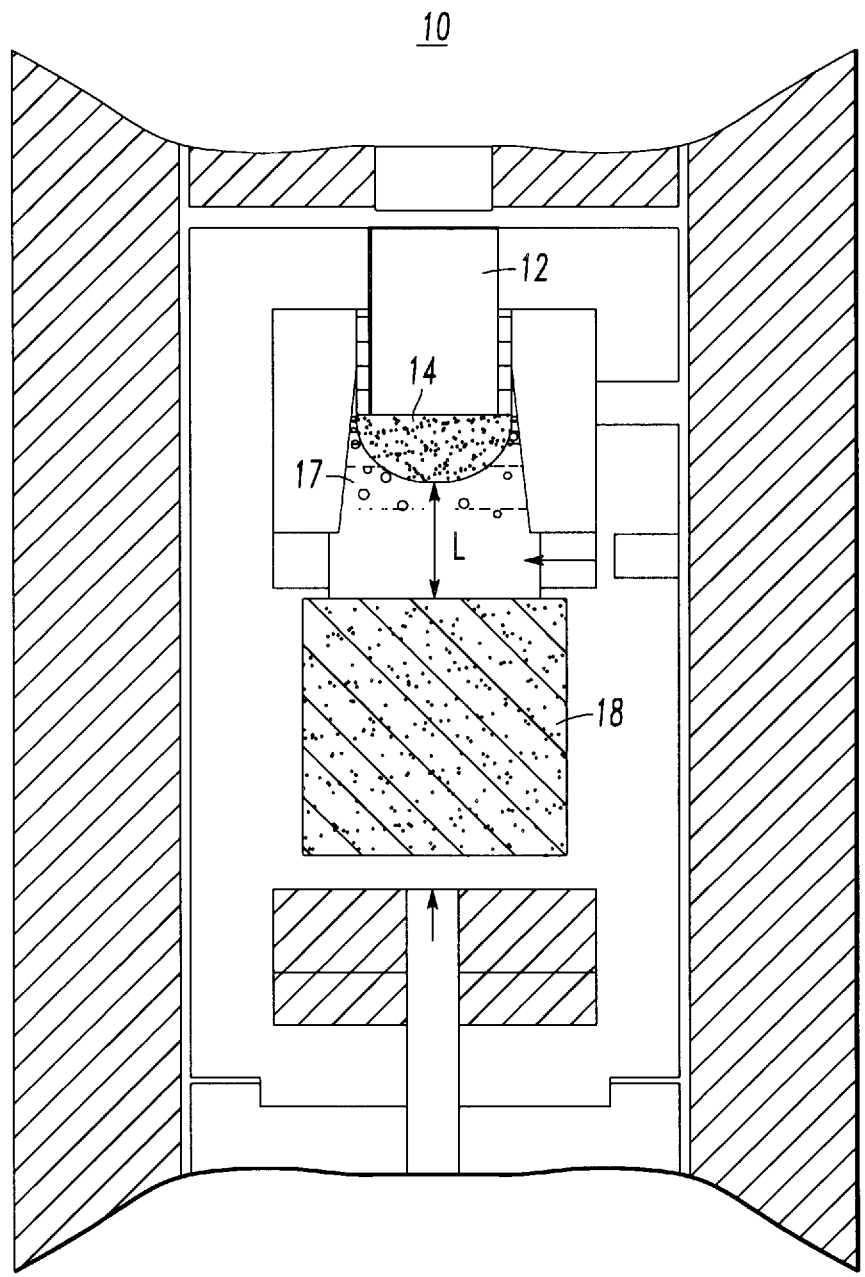
FIG. 2 is a cut-away view of a growth chamber for a physical vapor transport system.

Still referring to FIG. 2, the growth rate of the crystal is dependent upon the sublimation rate of the source material 18. Generally, the greater the sublimation rate, the greater the crystal growth rate.

The rate at which the source material 18 sublimes (evaporates) is a function of the source temperature (e.g. the temperature of the growth chamber at the source material 18) and the pressure of the ambient gas 17. The evaporation rate of the source material 18 dm/dt, can be qualitatively described by the expression:

$$dm/dt = D_{ab} dn/dx \qquad (1)$$

where $D_{ab}$ is the diffusion coefficient of the evaporant molecules (b) diffusing into the ambient gas 17 (a), n is the molar density of the evaporant molecules in moles/cm$^3$, and dn/dx is the molar concentration gradient of the evaporant across a diffusion layer adjacent the source material 18.

The relationship between the sublimation rate and pressure should be $1/p_a$, as defined in the equation:

$$D_{ab} = \{3(kT)^{3/2}/8P_a\sigma_{ab}^2 m_a + m_b)/m_a m_b^{1/2} \qquad (2)$$

Figure 4:
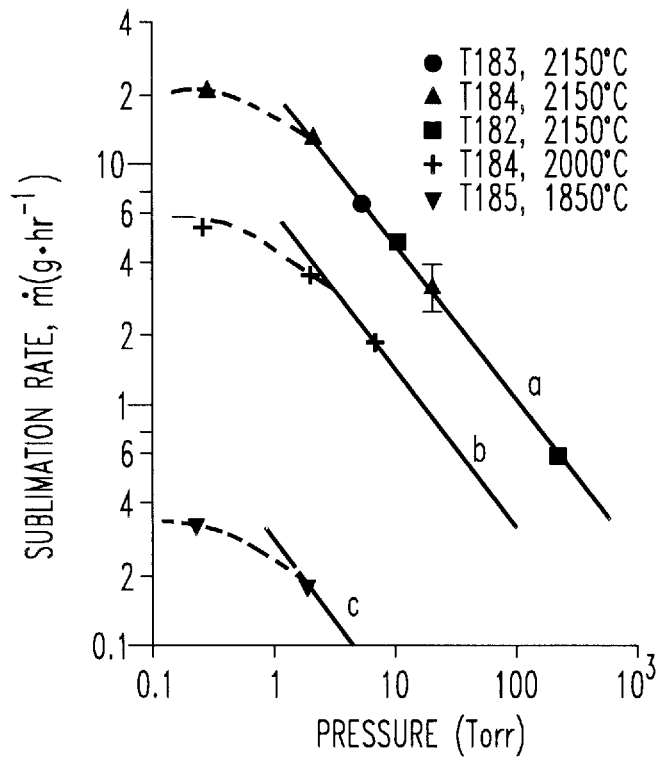
FIG. 4 is a graphical representation of sublimation role as a function of pressure.

Empirically, however, the dependence is observed to be $1/p_a^{2/3}$ power (for a constant temperature), as shown in FIG. 4. The variation from the ideal may be caused by the incongruent nature of the sublimation in silicon carbide (causing a change in the actual flux species with pressure), the effect of pressure variations on temperature, or in cases where the ambient gas includes nitrogen, the effects associated with the chemical reactivity of nitrogen at high temperature.

The relationship between the sublimation rate and temperature can be qualitatively defined as follows:

$$dm_s/dt = [D_{ab} hGw_sA_s n_o)/RT_s^2] \exp(-h/RT_s) \qquad (3)$$

where $D_{ab}$ is the diffusion coefficient (cm$^2$/sec) of the evaporant into the ambient, G is the temperature gradient (K/cm) at the source, $w_s$ is the molecular weight (g/mole) of the evaporant, $A_s$ is the cross-sectional area (cm$^2$) of the source crucible, $n_o$ is the limiting molar density (moles/cm$^3$) of evaporant when $T_s$ becomes very large (i.e. as $h/RT_s$ goes to zero), R is the gas constant (2 cal/mole K), $T_s$ is the source temperature (K), and h is the activation energy for sublimation (cal/mole) of the evaporant.

Figure 5:
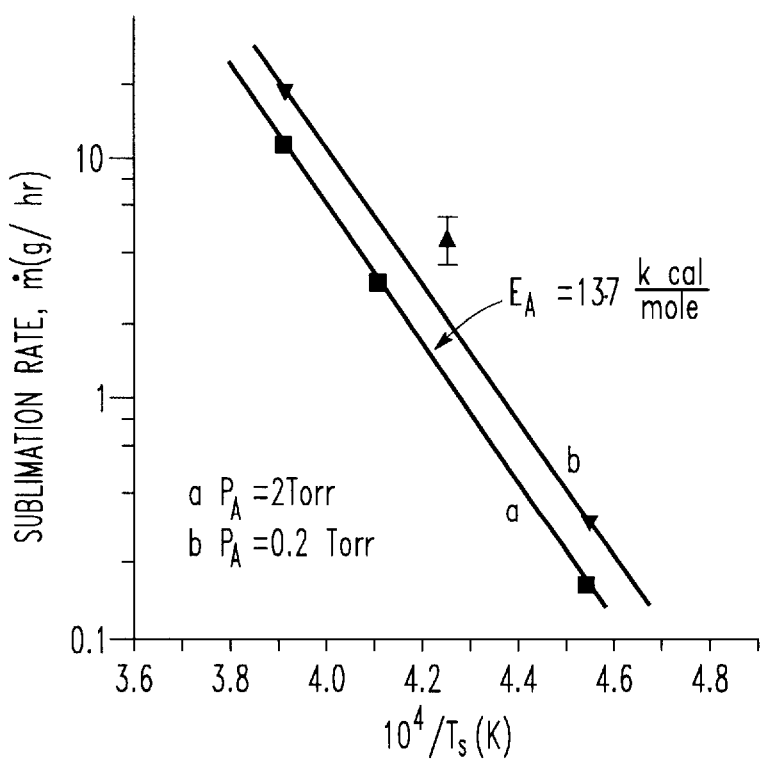
FIG. 5 is a graphical representation of polytype crystal growth in relation to the seed temperature and the distance from the seed.

FIG. 5 shows a plot of the sublimation rate versus temperature where the ambient pressure has been held constant. Note the sublimation rate goes exponentially as 1/T with an activation energy at approximately 137K cal/mole.

The foregoing shows that a decrease in the sublimation rate due to a decrease in temperature can be compensated by a decrease in ambient pressure. According to the method of the present invention, a decrease in the sublimation rate due to maintaining the crystal surface at less than about 2160° C. can be compensated for by a corresponding decrease in the ambient pressure.

C. Effect of Sublimation Rate on Crystal Growth Rate

Referring again to FIG. 2, the sublimation rate affects the amount of vapor contacting the seed crystal 14 and thus the crystal growth rate. The flux of the evaporating source material from the source material 18 to the crystal 14 is defined as:

$$J_B = -(D_{AB}/RT)[p/(p-P_B)]dp_B/dx \qquad (4)$$

where $J_B$ is the evaporant flux in moles/cm$^2$sec; $D_{AB}$ is the diffusion coefficient of B in the gas ambient A; R is the gas constant; p=pA+PB is the total pressure of the ambient and the evaporant; T is the temperature in K; and $dp_B/dx$ is the concentration gradient of the evaporant B between the source and the crystal. If we denote L as the distance between the source and the crystal, and the partial pressures of the evaporant at the source and the crystal are $pB_s$ and $pB_x$ respectively, the molar flux $J_{BX}$ arriving at the crystal can be written as:

$$J_{Bx} = -(pD_{AB}/RT_x L) \ln\{(p-p_{Bx})/(p-p_{Bs})\} \qquad (5)$$

where p=PA+PB. We next write pBx in terms of the partial pressure at the source Pbs using the approximation:

$$P_{Bx} = P_{Bs} - (dp_B/dT)_s \Delta T \qquad (6)$$

where $\Delta T = T_s - T_x$, the temperature difference between the source and crystal. From the Clausius-Clapeyron relation, we get:

$$(dp_B/dT)_s = hp_{Bs}/RT_s^2 \qquad (7)$$

where h is the molar heat of sublimation (cal/mole). Using relations (6) and (7), the molar flux of B at the crystal surface becomes:

$$J_{Bx} = (pD_{AB}/RT_x L) \ln\{1+(h\Delta T/RT_s^2)(p_{Bs}/p_A)\} \qquad (8)$$

In the case where silicon carbide is grown near 2000° C., the partial pressure of the evaporating species are much less than the ambient pressure, and equation (8) above can be approximated:

$$J_{Bx} = (D_{AB}/RT_x L)(h\Delta T/RT_s^2)p_{Bs} \qquad (9)$$

From the above equation we can infer that the crystal growth rate can vary approximately inversely with the ambient pressure through $D_{AB}$, that the temperature dependence of the growth rate should vary mainly as the exponential dependence of $P_{BS}$, that the growth rate varies as delta $T = T_s - T_x$, and that the growth rate varies inversely with the spacing between the crystal and the source material.

Figure 6:
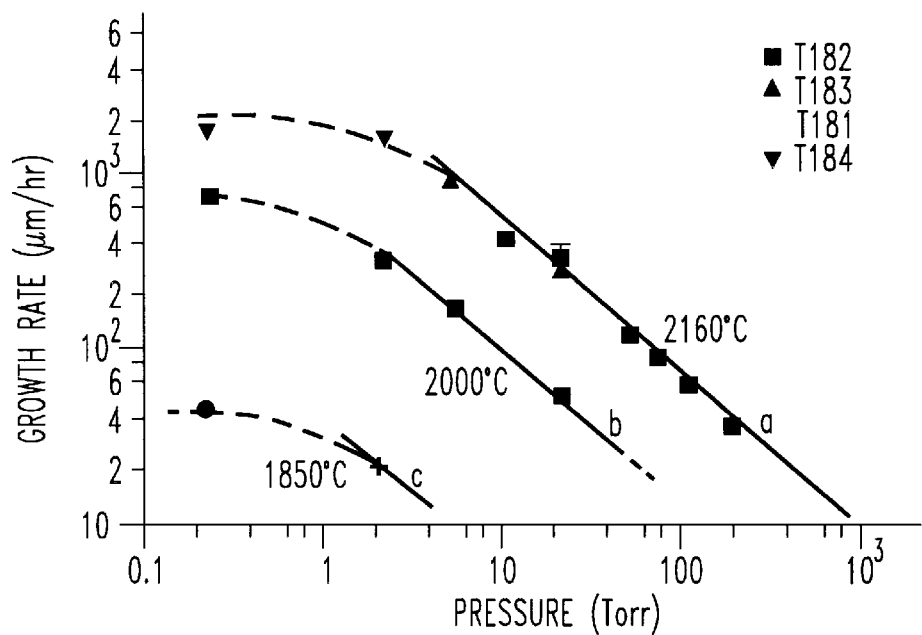
FIG. 6 is a graphical representation of crystal growth rate as a function of pressure.

FIG. 6 shows empirical data of the crystal growth rate as a function of pressure for three different constant temperatures. Note that a decrease in the crystal growth rate due to a decreased constant temperature can be compensated by a decrease in the ambient pressure, as long as the temperature is above a minimum crystal growing threshold. We have already shown that to obtain high yield of 4H polytype, the growth must be below about 2160° C. Therefore, a decrease in the crystal growth rate due to maintaining the crystal surface at less than about 2160° C. can be compensated for by a corresponding decrease in the ambient pressure of the growth chamber. When the temperature of the crystal surface is maintained at less than about 2160° C., the pressure of the growth chamber may be decreased to maximize the crystal growth rate. In some cases, the pressure of the growth chamber should be maintained at a pressure based on the temperature at the source material such that the sublimation of the source material is optimized to maximize the growth rate of the crystal.

D. Seed Orientation and Growth Rate

Figure 7:
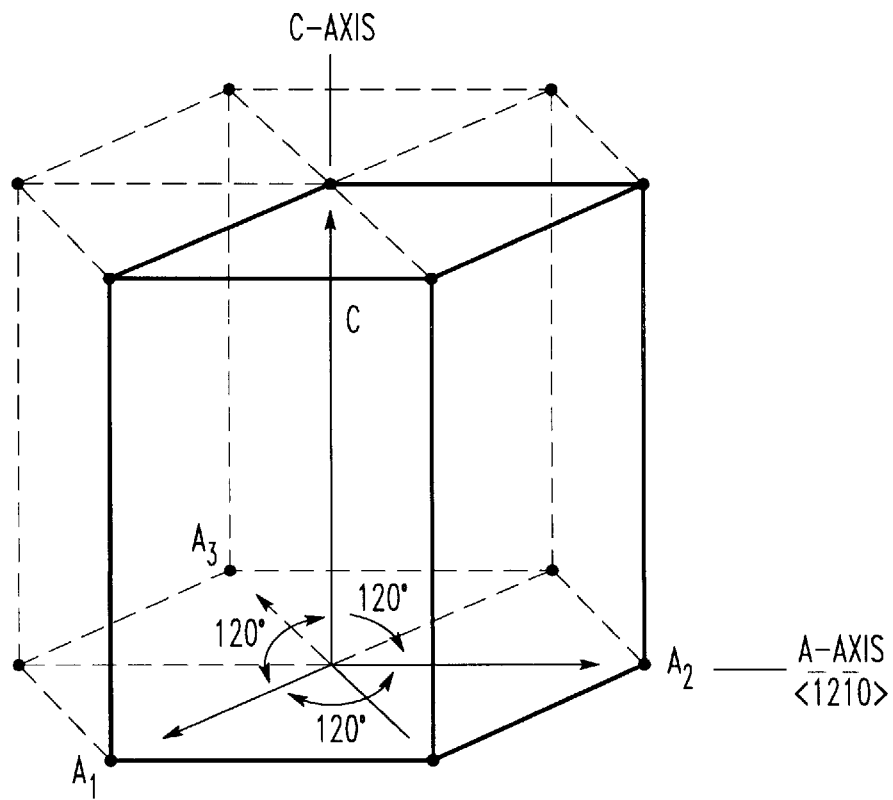
FIG. 7 is an illustration of a silicon carbide crystal.

The crystal growth rate also depends on the crystallographic orientation of the seed crystal. In the preferred embodiment the crystal is grown along the c-axis as shown in FIG. 7.

E. Seed Orientation and Growth Direction

Referring again to FIG. 2, in silicon carbide boule growth the face of the silicon carbide seed crystal 14 from which the crystal grows can affect the polytype structure of the crystal. For example, to maximize the 4H polytype yield the crystal should be grown from the carbon face of a 4H polytype seed crystal 14, and thus the seed crystal 14 should be mounted to the seed holder 12 accordingly.

In view of the foregoing, the present invention is a method of growing silicon carbide including the steps of 1) providing a PVT system having a growth chamber containing a seed holder, a crystal seed held by the seed holder, a source material and an ambient gas; 2) heating the growth chamber to thereby sublime the source material to thereby cause evaporation thereof into the ambient gas whereby the evaporant contacts the seed crystal causing crystal growth thereon; 3) maintaining the temperature of the crystal surface at less than about 2160° C. to thereby maximize the 4H polytype yield; and 4) maintaining the pressure of the growth chamber at a pressure based on the temperature at the source material such that the sublimation of the source material is optimized to maximize the growth rate of the silicon carbide crystal.

In step 1 above, the PVT system can be any PVT system known in the art having a growth chamber which contains a seed holder, a crystal seed and a source material. In the preferred embodiment, the <0001> 4H polytype seed crystal is silicon carbide having a carbon face and a silicon face and is held by the seed holder such that the crystal grows from the carbon face and along the <0001> c-axis. The source material can be any material known in the art which causes silicon carbide crystal growth and preferably high purity silicon carbide of mesh size between about 25 and 1000 microns and consisting of particles of either cubic or hexagonal polytypes. The ambient gas may be any ambient gas known in the art of growing silicon carbide crystals and preferably the ambient gas is high purity argon or a mixture of argon and any P or n-type doping gas (preferably nitrogen for n-type crystals).

As to step 2, the growth chamber may be heated by any means known in the art such as resistive heating or inductive heating. In the preferred embodiment, the growth chamber is heated by induction heating.

As to step 3, the crystal surface may be maintained below about 2160° C. by either maintaining the chamber at a constant temperature well below the 2160° C. threshold or by maintaining the crystal surface at a temperature below about 2160° C. by reducing the temperature of the chamber as the crystal grows. In the preferred embodiment, the crystal surface is maintained at a temperature between about 200° and 2160° C. The temperature of the crystal surface as it grows may be inferred directly by measuring the temperature at the seed crystal and at the source material and using a numerical finite-element modeling to approximate the temperature distribution within the chamber. The temperature may be measured by any means known in the art (optical emission, thermocouple,etc.).

As to step 4, the pressure of the chamber may be maintained at the desired pressure by any means known in the art. While the pressure may be maintained at less than about 10 Torr, it is preferred that the pressure be maintained between about 5 and 10 Torr. The desired pressure for optimum growth value may be determined using the measured temperature at the source material.

The foregoing process allows the production of boules comprised of 100% 4-H polytype silicon carbide having a diameter up to and exceeding 20 mm. The length of the boules are limited by the PVT system and may be up to or greater than 12 mm.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention and its practical application to enable one skilled in the art to utilize the invention in various embodiments and with various modifications as are suited to the particular use contemplated. It is intended that the scope of the invention be defined by the claims appended hereto, and their equivalents.

What I claim is:

1. A method of growing a 4-H polytype silicon carbide crystal comprising the steps of:
   a) providing a physical vapor transport growth chamber having a silicon carbide source material and a silicon carbide seed on a seed holder where the growth chamber is filled with a gas ambient;
   b) heating the growth chamber to thereby sublime the source material;
   c) exposing the silicon carbide seed to the sublimed source material to thereby grow a silicon carbide crystal from the carbon side of the silicon carbide seed in a direction extending away from the seed holder;
   d) maintaining the temperature of the growth chamber so that the surface of the silicon carbide crystal is at a temperature less than about 2120° C. to thereby increase the 4-H polytype yield of the silicon carbide crystal;
   e) maintaining the pressure of the growth chamber at a pressure based on the temperature at the source material such that the sublimation of the source material is optimized to maximize the growth rate of the 4H silicon carbide crystal.

2. The method of claim 1 wherein the silicon carbide source material is high purity silicon carbide material of mesh size between about 25 and 1000 microns and consisting of particles of hexagonal polytypes.

3. The method of claim 1 wherein the silicon carbide source material is high purity silicon carbide material of mesh size between about 25 and 1000 microns and consisting of particles of predominantly cubic polytypes.

4. The method of claim 1 wherein the seed crystal is oriented so that crystal growth is along the <0001> direction.

5. The method of claim 1 wherein the crystal is at least greater than about 20 mm in diameter and about 12 mm in length.

6. A method of growing a 4-H polytype silicon carbide crystal comprising the steps of:

a) providing a physical vapor transport system having a silicon carbide source material and a silicon carbide seed on a seed holder;

b) subliming the source material to thereby produce a sublimed source material;

c) exposing the silicon carbide seed to the sublimed source material to thereby grow a silicon carbide crystal from the silicon carbide seed in a direction extending away from the seed holder;

d) maintaining the surface of the silicon carbide crystal at a temperature less than about 2120° C. to thereby maximize the 4-H polytype yield of the silicon carbide crystal.

7. The method of claim 6 wherein the source material is maintained at a pressure less than about 10 Torr.

8. The method of claim 7 wherein the surface of the silicon carbide material is maintained at a temperature between about 2000° C. and 2120° C.

9. The method of claim 8 wherein the source material is maintained at a pressure between about 5 and 10 Torr.

10. The method of claim 6 wherein the silicon carbide crystal is grown from the carbon side of the silicon carbide seed.

11. In a physical vapor transport system having a growth chamber containing a silicon carbide source material and a silicon carbide seed crystal, wherein the growth chamber is at a temperature and pressure to cause sublimation of the source material and silicon carbide crystal growth from the seed crystal, the method of:

a) maintaining the temperature of the surface of the crystal at less than 2160° C. and b) maintaining the pressure of the growth chamber at a pressure based on the temperature of the growth chamber at the source material such that sublimation of the source material is optimized to maximize the growth rate of the 4H silicon carbide crystal.

12. The method of claim 11 wherein the seed crystal is oriented so that the silicon carbide crystal grows from the carbon face of the seed crystal.

13. The method of claim 11 wherein the surface of the crystal is maintained at a temperature between about 2000° and 2100° C.

14. A silicon carbide crystal made from the process of claim 11.

* * * * *